United States Patent [19]

Venutti

[11] 4,069,443
[45] Jan. 17, 1978

[54] INTEGRATED VERTICAL-SWEEP GENERATOR FOR TELEVISION RECEIVER

[75] Inventor: Luigi Venutti, Monza (Milan), Italy

[73] Assignee: SGS-ATES Componenti Elettronici S.p.A., Agrate Brianza, Italy

[21] Appl. No.: 702,049

[22] Filed: July 2, 1976

Related U.S. Application Data

[63] Continuation-in-part of Ser. No. 487,749, July 11, 1974, abandoned.

[30] Foreign Application Priority Data

July 13, 1973 Italy .................................. 26549/73

[51] Int. Cl.$^2$ ............................................. H01J 29/70
[52] U.S. Cl. .................................... 315/395; 315/403; 315/408; 315/410
[58] Field of Search ............... 315/403, 407, 408, 409, 315/410, 395

[56] References Cited

U.S. PATENT DOCUMENTS

| | | | |
|---|---|---|---|
| 3,441,791 | 4/1969 | Beck | 315/408 |
| 3,727,096 | 4/1973 | Wilcox | 315/403 X |
| 3,794,877 | 2/1974 | Smith et al. | 315/403 |
| 3,979,641 | 9/1976 | Arakawa et al. | 315/403 |

*Primary Examiner*—Richard A. Farley

*Attorney, Agent, or Firm*—Karl F. Ross

[57] ABSTRACT

A vertical-sweep generator for a deflection yoke of a cathode-ray tube in a television receiver comprises a monolithic integrated semiconductor chip including transistors and resistors defining, together with external circuit elements, a free-running multivibrator (O, O$_1$), an associated synchronizing circuit (O$_2$), and a ramp-current generator (RC, RC$_1$) controlled by the multivibrator in order to regulate the yoke current by way of a power amplifier (PA) and a flyback circuit (FG). The multivibrator generates short switching pulses, of a duration equaling about one-fourth of the flyback period, whose disappearance coincides with the start of the ramp current; these switching pulses are triggered by externally applied synchronizing pulses and cause the blocking of a discharge loop for a sweep capacitor in series with the yoke, charged in the second half of the flyback period, whereby the discharge current flowing at the end of a sweep cycle is directed into a storage circuit (C109, C110) during the first half of the next flyback period preparatorily to a recharging of the sweep capacitor. Upon termination of the switching pulse, the blocking of the discharge loop is maintained during the remainder of the flyback period by a clamping circuit (PA$_2$) responsive to a voltage differential between the storage circuit and the power supply.

10 Claims, 4 Drawing Figures

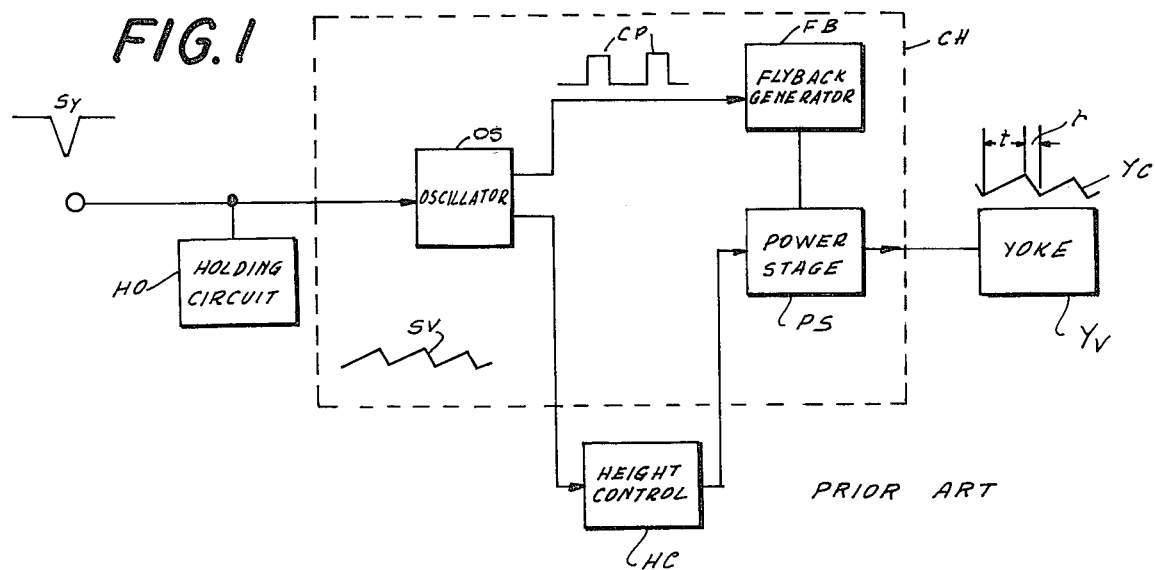
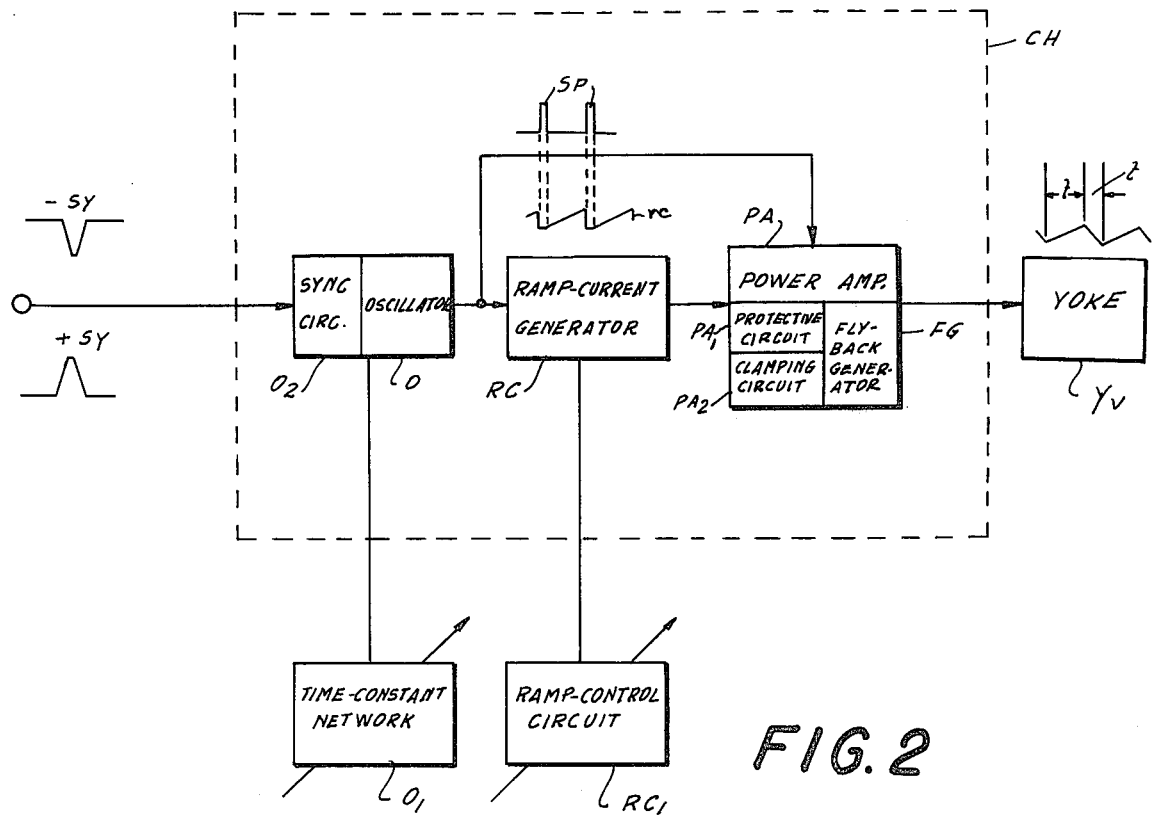

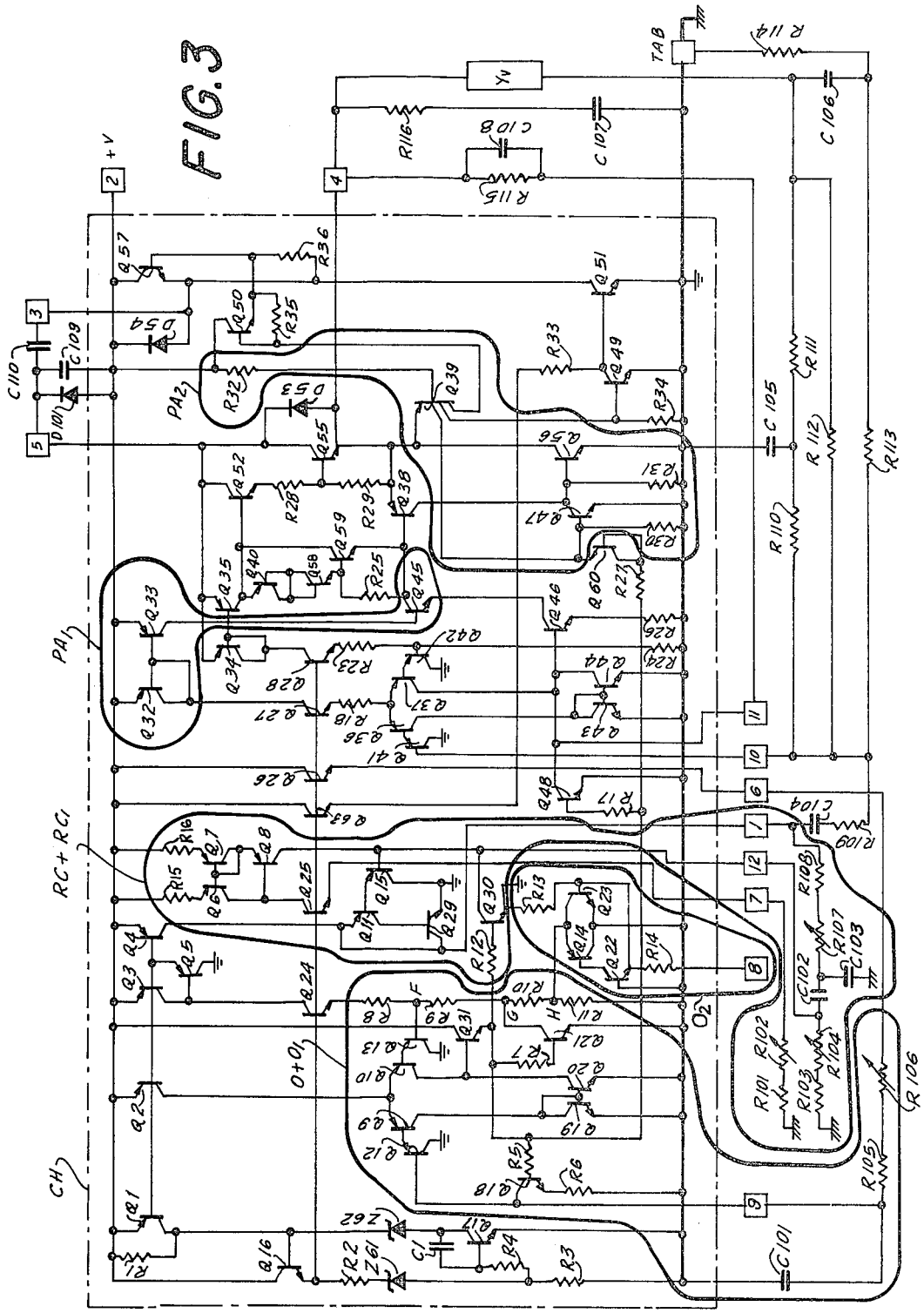

INTEGRATED VERTICAL-SWEEP GENERATOR FOR TELEVISION RECEIVER

CROSS-REFERENCE TO RELATED APPLICATION

This application is a continuation-in-part of my copending application Ser. No. 487,749 filed 11 July 1974 and now abandoned.

FIELD OF THE INVENTION

My present invention relates to a vertical-sweep generator for a cathode-ray tube of a television receiver in which the beam is vertically deflected by a split inductance coil referred to in the art as a yoke. More particularly, the sweep generator here envisaged is to be of a type whose components can be incorporated, for the most part, in a monolithic integrated block or chip.

BACKGROUND OF THE INVENTION

The sweep cycle of a beam-deflecting system is divided into a relatively long forward phase, or trace, and a relatively short flyback phase, or retrace. In conventional systems of this type, e.g. as described by M. E. Wilcox in an article entitled "A Complete Monolithic Vertical-Deflection System for Television", IEEE Transactions on Broadcast and Television Receivers, Vol. BTR-17, No. 4, November 1971, the two phases are produced under the control of a sawtooth oscillator whose output voltage rises progressively from a base level during the trace and drops back to that level during the retrace, the length of the flyback phase being determined by a rectangular pulse emitted by that generator. The flyback is generally accompanied by a blanking of the beam of the cathode-ray tube.

It has already been proposed (see U.S. Pat. No. 3,727,096) to provide capacitive storage means in a scanning circuit of such a deflection system for accumulating some of the yoke energy available during the forward sweep in order to produce a flow of reverse current during flyback. In all these conventional systems, the duration of the flyback phase is controlled by the sawtooth oscillator and cannot be selected independently of other parameters of the sweep cycle.

OBJECT OF THE INVENTION

The object of my present invention, therefore, is to provide an improved vertical-sweep generator of this nature in which the slope of the trace, the overall cycle length and the duration of the flyback period can be independently adjusted.

SUMMARY OF THE INVENTION

I realize this object, in accordance with my present invention, by providing an oscillator preferably in the form of a free-running multivibrator which generates a periodic switching pulse at the start of a recurrent sweep cycle, this pulse lasting only for a fraction (e.g. about one-fourth) of the flyback phase of that cycle. With this switching pulse the oscillator controls electronic switch means, such as a transistor in the output stage of a power amplifier, for temporarily blocking the flow of reverse current in a discharge loop of a scanning circuit at the end of a sweep cycle. A capacitive storage circuit, chargeable by a source of direct current which energizes the various amplifier and oscillator stages, then receives reverse current from the deflection coil and from a sweep capacitor connected in the usual manner in series therewith, that capacitor having been previously charged by the source in a supply path forming part of the scanning circuit. The voltage difference existing at that point between the source and the storage circuit is used for the control of clamping means serving to maintain the blocking of the discharge loop over a period exceeding the duration of the switching pulse, i.e. for the remainder of the flyback phase, until a renewed flow of charging current into the sweep capacitor from the storage circuit reaches a peak to mark the end of that phase. The charging and reverse currents traversing the coil during the forward sweep are regulated, as required for linearization of the scan, by the power amplifier under the control of a ramp-current generator whose output current returns to its base level in response to the switching pulse of the oscillator and varies monotonically from that level upon the termination of the pulse, thus leaving its base level well before the end of the flyback phase. An intermediate stage of the power amplifier, including the transistor used as an electronic switch for alternately blocking and unblocking a final-stage transistor in the discharge loop of the sweep capacitor, is therefore under the control of the ramp current from the instant of the deactivation of the clamping means at the start of a new forward sweep.

According to another feature of my invention, the free-running multivibrator generating the switching pulses may be provided with a trigger circuit including a pair of complementary transistors with a common input terminal which is energizable by external synchronizing pulses of either polarity whereby positive or negative sync pulses can be used to determine the start of a sweep cycle.

BRIEF DESCRIPTION OF THE DRAWING

The above and other features of my invention will now be described in detail with reference to the accompanying drawing in which:

FIG. 1 is a block diagram of a conventional integrated vertical-sweep generator;

FIG. 2 is a block diagram similar to FIG. 1, showing a sweep generator embodying my present invention;

FIG. 3 is a detailed circuit diagram of the sweep generator shown in FIG. 2.

SPECIFIC DESCRIPTION

Figure 4:
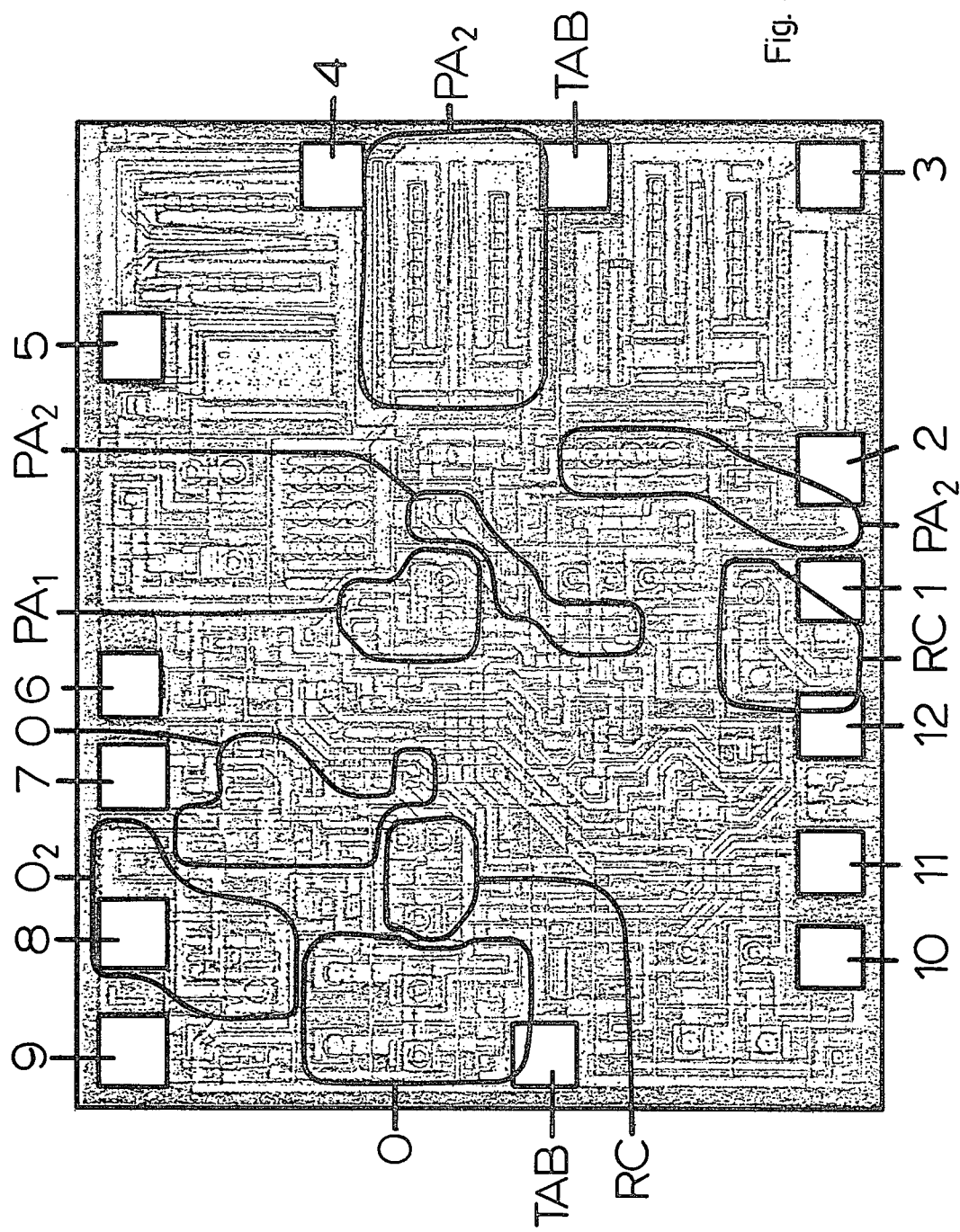
FIG. 4 is a face view of a monolithic semiconductor chip according to my invention, showing the layout of the integrated components of the circuit arrangement of FIG. 3.

In FIG. 1 I have shown a conventional vertical-sweep generator of the type described in the aforementioned article by M. E. Wilcox. An oscillator OS produces a sawtooth voltage $sv$ and a train of control pulses $cp$ which are coextensive with the descending trailing edges of the sawtooth voltage. Pulses $cp$ actuate a flyback generator FB working into a power stage PS. These components are integrated in a monolithic chip CH and are supplemented by external elements including a holding circuit HO, a height-control circuit HC and a deflection yoke $Y_v$ of an otherwise nonillustrated cathode-ray tube. Synchronizing pulses $sy$ are applied to holding circuit HO and oscillator OS in parallel. The various components are energized from an external power supply (not shown).

The current $yc$ passing through the yoke $Y_v$ has the same sawtooth shape as the output voltage $sv$ of oscillator SO, with a rising flank forming a trace period $t$ and a falling flank forming a retrace period $r$. The latter period is again coextensive with the control pulses $cp$ delivered by oscillator OS.

In FIG. 2 I have shown a generally similar chip CH with the following integrated components: an oscillator O with associated synchronizing circuit $O_2$; a ramp-current generator RC; a power amplifier PA with an associated protective circuit $PA_1$ and clamping circuit $PA_2$; and a flyback generator FG driven by amplifier PA. External components include an adjustable time-constant network $O_1$ for determining the frequency of oscillator O, an adjustable ramp-control circuit $RC_1$ associated with current generator RC, and the yoke Y, to be energized by power amplifier PA and flyback generator FG.

As indicated in FIG. 2, sync circuit $O_2$ responds to both negative pulses $-sy$ and positive pulses $+sy$. The output of oscillator O is a train of switching pulses $sp$ which, in contrast to the control pulses $cp$ shown in FIG. 1, last for only one-fourth of a retrace or flyback period $r$. A ramp current $rc$ produced by generator RC, instantly descending to zero on the leading edge of a switching pulse $sp$, begins to rise on the trailing edge of that switching pulse and therefore already has a significant magnitude at the beginning of a trace period $t$. Though the pulse widths and the flyback period have been shown approximately in proportion in FIGS. 1 and 2, the ratio $t:r$ is not drawn to scale.

As in the conventional system of FIG. 1, the flyback generator FG of FIG. 2 also produces blanking pulses for suppressing the beam of the cathode-ray tube during the retrace.

In FIG. 3 I have shown details of the components O, $O_1$, $O_2$, RC, $RC_1$, $PA_1$ and $PA_2$, discussed with reference to FIG. 2, as well as other circuit elements (including those of sections PA and FG) integral with chip CH or external thereof. The chip is provided with several terminals 1–12 as well as a ground terminal TAB; terminal 2 represents a source of positive operating voltage $+V$. The integrated circuit elements are transistors Q1–Q52, Q54–Q60 and Q63; resistors R1–R18 and R23–R36; rectifying diodes D53 and D54; Zener diodes Z61 and Z62; and a capacitor C1. External elements include resistors R101–R116, capacitors C101–C110 and a diode D101.

The Zener diodes, the capacitor C1, transistors Q1–Q8, Q17, Q26–Q28 and Q63 as well as associated resistors R1–R4, R15 and R16 form part of a basically conventional temperature-compensated and voltage-stabilized current-distribution network connected to source terminal 2, serving to energize the other circuit elements with constant currents (even though such a constancy is not required in all instances, as for example in the case of transistors Q27 and Q63). PNP transistors Q32 and Q33, with interconnected bases tied to the collector of transistor Q32, serve as an image-current generator designed to replicate the collector current of the latter transistor in the output of transistor Q33. Similar image-current generators are constituted by transistors Q6 and Q7, Q19 and Q20, Q34 and Q35, Q43 and Q44. The bases of PNP transistors Q1–Q4 are all interconnected, as are the bases of NPN transistors Q24–Q28 and Q63.

Oscillator O + $O_1$ comprises a differential amplifier with two Darlington pairs Q9, Q12 and Q10, Q13, connected as a free-running multivibrator with positive feedback provided by transistors Q18, Q21 and Q31. The emitters of PNP transistors Q9 and Q10 are energized from current generator Q2 while their collectors are grounded through the current-imaging pair Q19 and Q20. One of the inputs of this differential amplifier, i.e. the base of grounded-collector PNP transistor Q12, is connected through terminal 9 to the junction of capacitor C101 with resistor R105; capacitor 101 is grounded at terminal TAB while resistor R105 is connected through adjustable resistor R106 to terminal 6. The other input of the differential amplifier, i.e. the base of grounded-collector PNP transistor Q13, is tied to a tap F of a voltage divider consisting of resistors R8–R11, this voltage divider lying between ground and the two series-connected transistors Q3 (PNP) and Q24 (NPN). NPN transistor Q31, whose collector is tied directly to high-voltage terminal 2, has its base joined to the collector of transistor Q10 and its emitter connected through resistor R12 to the base of NPN transistor Q30 forming part of the ramp-current generator RC + $RC_1$. Via resistors R5, R17 and R27, the emitter of transistor Q31 is also connected to the base of transistor Q18 within the oscillator, to the base of transistor Q48, and to the base and collector of transistor Q60. Transistor Q18 has its collector tied to terminal 9 and its emitter grounded through resistor R6. Transistor Q21, whose emitter is grounded, has its base connected through resistor R7 to the emitter of transistor Q31 and has its collector joined to a tap G between sections R9 and R10 of the aforementioned voltage divider. Another tap H of that divider, between sections R10 and R11 thereof, is connected within sync circuit $O_2$ to the emitter of PNP transistor Q14 and to the collector of NPN transistor 23, the collector of the former and the emitter of the latter being both grounded. The base of transistor Q14 is tied to the collector of complementary (NPN) transistor Q22 whose own base is grounded and whose emitter shares a common lead with the base of transistor Q23, this lead being grounded through resistor R13 and being connected via resistor R14 to terminal 8 to which externally generator synchronizing pulses $+sy$ or $-sy$ (see FIG. 2) are periodicaly applied.

The operation of the pulse-generating unit O + $O_1$ + $O_2$ is as follows:

With capacitor C101 discharged, Darlington pair Q9, C12 conducts and raises the base voltage of transistors Q19 and Q20, thereby cutting off the transistors Q31, Q18 and Q21. The resulting increase in the potential of tap G, together with that of the other points F and H of the voltage divider R8–R11, blocks the Darlington pair Q10, Q13. Capacitor C101 then charges at a constant rate via transistor Q26 and terminal 6 in series with resistors R105 and R106, the adjustment of the latter resistor determining the charging rate and therefore the time necessary to trip the bistable circuit comprising the two Darlington pairs. When the capacitor potential has reached a value sufficiently positive to cut off the transistor Q12 and its mate Q9, transistors Q10, Q13, Q18, Q21 and Q31 all become conductive; the several divider taps F, G and H now drop to their alternate potential levels while the saturation of transistor Q18 rapidly discharges the capacitor C101 through resistor R6 to restart the cycle. The time constant of network R6, C101 is consistent with the narrow switching pulses $sp$ shown in FIG. 2.

If a positive sync pulse is applied to terminal 8, transistor Q23 saturates and virtually grounds the tap H; this effectively reduces the resistance of the bottom section of the voltage divider R8–R11 from, say, 1.2 k$\Omega$ to a few tens of ohms. A negative sync pulse, by causing conduction of the cascaded complementary transistors Q22 and Q14, has a similar effect. The resulting lowering of the potential of tap F switches the multivibrator into its alternate, short-term state in which transistors Q31, Q18 and Q21 are saturated and capacitor C101 discharges. Such a switchover may occur if the free-running frequency of the oscillator exceeds the cadence of the sync pulses by up to about 20%.

The ramp-current generator includes the capacitors C102 and C103 as well as the resistors R101–R104 and R107, R108 in its external part $RC_1$. Its internal part RC comprises the symmetrical pair of PNP transistors Q6, Q7 whose emitters are connected to potential on terminal 2 via resistors R15 and R16. This part also includes PNP transistor Q8, lying in series with transistor Q7 between the collector thereof and terminal 12; NPN transistor Q25, similarly inserted between the collector of transistor Q6 and terminal 7; PNP transistors Q11 and Q15, connected as a Darlington pair in parallel with NPN transistor Q29; and NPN transistor Q30 controlled by transistor Q31 in oscillator section O. The emitters of transistors Q29 and Q30 as well as the collector of transistor Q15 are grounded; the base of transistor Q15 and the collector of transistor Q30 are tied to the collector of transistor Q8. Transistor Q11, whose emitter receives operating current from transistor Q4, has its collector connected to the base of transistor Q29 and has its emitter connected in parallel with the collector of the latter transistor to terminal 1. The base of transistor Q8 is tied to the junction of the collectors of transistors Q6 and Q25.

Terminal 7 is grounded through the series combination of resistors R101 and R102, the latter being adjustable. Terminal 12 is connected to the junction of capacitor C102 with adjustable resistor R104 which is grounded through resistor R103 in series therewith. Terminal 1 is connected via the series combination of adjustable resistor R107 and fixed resistor R108 to the junction of capacitors C102 and C103, one electrode of the last-mentioned capacitor being grounded.

During the first quarter of a flyback period, with transistor Q31 conducting, transistor Q30 saturates and virtually grounds the terminal 12, thereby discharging the series combination of capacitors C102 and C103. With the disappearance of the switching pulse represented by the lower threshold voltage on taps F, G and H, and upon the resulting cutoff of transistor Q31, transistor Q30 also becomes nonconductive and allows the capacitors C102, C103 to charge via transistors Q7 and Q8 at a rate determined by the current drawn from transistors Q6 and Q25 via terminal 7 and resistors R101, R102. Thus, the setting of resistor R102 determines the rapidity of the rise in the capacitor potential which results in the flow of a corresponding ramp current through resistors R107 and R108, capacitor C104 and resistor R109 in series; the slope and amplitude of the ramp current are adjustable with the aid of resistor R107. The linearization of the yoke current requires a certain modification of this ramp current which is achieved on the one hand by introducing a parabolic component with the aid of a supplemental current, drawn through transistor Q4 under the control of transistors Q11, Q15 and Q29 responsive to the capacitor voltage on terminal 12, and on the other hand by negative feedback via external network R110–R113, C105 connected across sweep capacitor C106 which lies between deflection coil $Y_v$ and grounded resistor R114. An adjustable exponential predistortion of the charge of capacitor C102 is achieved through the shunt current traversing the resistors R103 and R104. The output voltage of the ramp-current generator appears on terminal 10 and thus at the base of PNP transistor Q41 constituting the noninverting input of a differential amplification stage Q36, Q37, Q41–Q44 (similar to multivibrator Q9, Q10, Q12, Q13, Q19, Q20) forming part of the power amplifier PA.

The base of PNP transistor Q42, representing the reference input of the differential amplification stage, is tied to the junction of resistors R23 and R24 inserted as a voltage divider between ground and the emitter of NPN transistor Q28 which is energized from supply terminal 2 or from the upper yoke terminal 4, whichever happens to have the higher positive potential, via PNP transistor Q34 in series with diodes D101 and D53, respectively. The emitters of PNP transistors Q36 and Q37 receive their operating current through resistor R18 from NPN transistor Q27 in series with PNP transistor Q32 which, together with its mate Q33 and NPN transistor Q45, constitutes the protective circuit $PA_1$. The collector of transistor Q37, acting as the output of the differential amplification stage, is tied to terminal 11 as well as to the collectors of NPN transistors Q44, Q48 and to the base of NPN transistor Q46; the latter transistor has its collector joined to the emitter of protective transistor Q45 and has its emitter grounded through resistor R26. Terminals 4 and 11 are short-circuited for high frequencies through capacitor C108 shunted by resistor R115.

The external negative-feedback network includes an a-c branch formed by resistors R112, R113 and a d-c branch comprising resistors R110, R111 whose junction is grounded for alternating current via capacitor C105. The d-c branch establishes a mean input voltage, derived from the voltage swing at the junction of coil $Y_v$ and capacitor C106, on terminal 10; the differential stage automatically compares this mean input voltage with the reference voltage on the base of transistor Q42 and continuously readjusts the mean level of the voltage on terminal 4.

At the beginning of a sweep cycle, i.e. in the first quarter of its flyback phase, positive voltage on the emitter lead of switching transistor Q31 virtually grounds the output terminal 11 by saturating the transistor Q48. Transistor Q46, which drives the final stage Q55, Q56 of amplifier PA, is cut off at the same time since its base-emitter circuit is shunted by transistor Q48. This operation open-circuits the emitter of the protective transistor Q45, normally saturated by the collector current of transistor Q33 in its base lead, so that its emitter potential tends to follow its collector potential which approximates the voltage at the upper yoke terminal 4 and at that instant is more positive than the supply voltage +V as will be shown hereinafter. Since the base potential of transistor Q45 cannot exceed this supply voltage, transistor Q45 is desaturated and interposes a significant resistance between terminal 4 and driving transistor Q46 just when the terminal voltage approaches its highest level.

PNP transistor Q38, which with NPN transistor Q45, Q47 forms part of the intermediate or driving stage of amplifier PA, has its collector grounded by way of resistor R31; that collector is also tied to the base of final-stage transistor Q56 and to the collector of the associated shunt transistor Q47 whose base is grounded through resistor R30 and is further connected to the emitter of PNP transistor Q60 as well as to one of three collectors of multicollector PNP transistor Q39. This multicollector transistor, whose base is energized from terminal 2 via resistor R32, forms part of the clamping circuit $PA_2$ in which the switching transistor Q47 and the final transistor Q56 are also shown to be included. The other two collectors of transistor Q39 have leads terminating at the bases of NPN transistors Q49 and Q50 forming part of the flyback circuit FG (FIG. 2) more fully described hereinafter.

The final amplifier stage comprises the two transistors Q55 and Q56 serially connected between ancillary terminal 5 and ground; the junction between the emitter of transistor Q55 and the collector of transistor Q56 is tied to the emitters of multicollector transistor Q39 and of transistor Q38. The base of transistor Q55 is connected to the junction of resistors R28 and R29 serially inserted between the emitters of PNP transistors Q38 and Q52; the latter transistor forms a Darlington-type pair with transistor Q55 and also has its collector tied to terminal 5. A biasing circuit for transistor Q55, operating in the A-B amplification mode, includes the cascaded PNP transistors Q35 and Q40, the NPN transistor Q58 connected in antiparallel relationship across transistor Q40, and the transistor Q59 whose emitter is tied to the junction of the base of transistor Q38 with the collector of transistor Q45 and whose collector is connected to the junction of the base of transistor Q52 with the collector of transistor Q35 and with the emitter of transistor Q40. The base of transistor Q59, joined to the emitter of transistor Q58, is returned to its own emitter via resistor R25.

Ancillary terminal 5 is linked via diode D101 with the source terminal 2 and, with transistor Q55 conducting, forms part of a supply path extending to the upper yoke terminal 4 whereby charging current for the sweep capacitor C106 can flow in the first half of a trace period through coil $Y_y$ and low-ohmic resistor R114 to ground on terminal TAB. Conduction of transistor Q56 completes a discharge loop for this sweep capacitor in the second half of a trace period. The potential of the ungrounded end of resistor R114, fed back via resistor R113 to terminal 10, varies with the yoke and thus changes from a positive peak to a negative peak in the course of a trace; to this voltage a leading component is added, transmitted to terminal 10 by way of resistor R112. The combined feedback voltage thus varies generally inversely with reference to the output voltage of ramp-current generator $RC + RC_1$, transmitted via capacitor C104 and resistor R109, which starts its rise from a negative level in the first half of the retrace period. The two voltages may substantially balance each other at the beginning of the trace, with the generator voltage predominating just enough to initiate conduction of driving transistor Q46 which is cut off during retrace.

The flyback generator FG includes condensers C109, C110, diodes D53, D54, D101, and NPN switchover transistors Q49, Q50, Q51, Q57. Transistor Q49, whose emitter is grounded and whose base is returned to ground through resistor R34, has its collector connected to potential on terminal 2 via transistor Q63 and resistor R33, this collector being also tied to the base of transistor Q51 whose emitter is likewise grounded. The collector of transistor Q51, saturated during the trace period, is tied to terminal 3 which is connected directly to the emitter and through resistor R36 to the base of transistor Q57 whose collector is tied to terminal 2. The base of transistor Q57 is also joined to the emitter of transistor Q50 which is returned to its own base via resistor R35; the collector of transistor Q50 is directly connected to terminal 2. Diode D53, connected across the collector-emitter path of transistor Q55 in antiparallel relationship therewith, bucks the current flow through diode D101 which lies between terminals 2 and 5 in shunt with condenser C109. Condenser C110 is inserted between terminals 3 and 5.

The operation of power amplifier PA and flyback generator FG is as follows:

At the beginning of a sweep cycle, when transistor Q31 in oscillator section O is saturated during the first quarter of a retrace period, the concurrent saturation of transistors Q47 and Q48 cuts off the transistors Q56 and Q46, respectively. This blocks the flow of reverse current from sweep capacitor C106 and coil $Y_y$ in the discharge loop including transistor Q56, causing a sharp rise in the voltage of terminal 4 whereby diode D53 is forwardly biased and the discharge continues through that diode, capacitor C110, diode D54, terminal 2 and the external current supply to ground. The voltage rise on terminal 4 is moderated by the presence of capacitor C107 connected between this terminal and ground, in series with resistor R116, and also by shunt capacitor C109 which protects the diode D101 against reverse transients. With the emitter of multicollector transistor Q39 now more positive than its base, that transistor saturates and clamps a saturating voltage on the base of transistor Q47 which thus maintains the cutoff of transistor Q56 even after the disappearance of the switching pulse *sp* from oscillator $O + O_1$, i.e. upon de-energization of the emitter lead of transistor Q31. The second collector lead of transistor Q39 saturates the transistor Q49 to cut off the transistor Q51 whereby the potential of terminal 3 rises sharply from near-ground level to the supply level $+V$. This results in a corresponding increase of the voltage on ancillary terminal 5, with stopping of the reverse-current flow from the scanning circuit $Y_y$, C106 and resumption of a forward flow in the second half of the flyback phase by way of transistor Q55 which conducts when the voltage on terminal 5 exceeds that on terminal 4.

Despite the increasingly positive feedback voltage and the beginning rise of the ramp-generator voltage during this phase, the voltage of input terminal 10 of power amplifier PA remains low enough to maintain conduction in the Darlington pair Q36, Q41 to the exclusion of the pair Q37, Q42. The current flow on the common collector lead of transistors Q36 and Q43 keeps the transistor Q44 conductive to maintain the cutoff of driving transistor Q46 even after the termination of the switching pulse which saturates the transistor Q48 in the early part of the retrace period. Furthermore, the reference voltage on the right-hand input of the differential stage Q36 etc. — i.e. the base of transistor Q42 — is kept high during retrace inasmuch as the potential of terminal 5 is then more positive than the supply voltage $+V$. The path for the forward current, which cannot pass the diode D54, is completed through transistor Q57 which is rendered conductive by the saturation of its companion transistor Q50 whose base receives positive voltage from one of the collectors of clamping transistor Q39.

When the storage condensers C109 and C110 have transferred enough of their charge to sweep capacitor C106 to reduce the voltage on terminal 5 to the supply level $+V$, transistor Q39 is cut off and de-energizes the bases of transistors Q47, Q49 and Q50, ending the retrace period. The resaturation of transistor Q51 virtually grounds the terminal 3 whereby the voltage on terminal 5 is frozen at the supply level as the inductance of yoke $Y_v$ continues to draw charging current through transistor Q55. The increasing conduction of transistor Q46, due to the rising output voltage of ramp generator RC+RC$_1$, applies a progressively lower biasing voltage to the base of transistor Q38 by way of transistor Q45 which now again operates in saturation; this drives the base of transistor Q56 ever more positive, unblocking the discharge loop through this transistor and halting the flow of charging current into sweep capacitor C106 at the midpoint of the trace period. Thereafter, reverse current flows at an increasing rate through the loop until the arrival of the next switching pulse starts a new sweep cycle.

In FIG. 4 I have shown an actual semiconductor chip incorporating the various components included within the rectangular outline CH in FIG. 3. This Figure illustrates the layout of sections, O, RC, PA$_1$ and PA$_2$ as well as the various terminals 1–12 and TAB described above.

The independence of the length of the retrace period from the parameters of oscillator O+O$_1$ allows this oscillator to be designed with less precision, and therefore more economically, than corresponding units in conventional systems of this general type.

I claim:

1. A vertical-sweep generator for a cathode-ray tube of a television receiver, comprising:
   oscillator means for generating a periodic switching pulse to start a recurrent sweep cycle divided into a relatively short retrace period and a relatively long trace period;
   a ramp-current generator connected to said oscillator means for producing an output current returning to a base level in response to said switching pulse and varying monotonically from said level upon the termination of said switching pulse;
   a source of direct current;
   a scanning circuit including a deflection coil and a sweep capacitor in series, said scanning circuit forming a supply path for the feeding of charging current from said source via said coil to said sweep capacitor and a discharge loop for passing reverse current from said sweep capacitor through said coil;
   amplifier means in said scanning circuit for regulating said charging and reverse currents under the control of said output current;
   electronic switch means controlled by said oscillator means for temporarily blocking the flow of reverse current in said discharge loop at the end of a sweep cycle and starting the retrace period of a new cycle in response to said switching pulse;
   capacitive storage means chargeable by said source and connected to said scanning circuit for receiving residual reverse current from said sweep capacitor in a first part of said retrace period, upon a blocking of said discharge loop by said switch means, and delivering a charging current via said supply path to said sweep capacitor in a second part of said retrace period; and
   clamping means responsive to a voltage difference between said source and said storage means for maintaining the blocking of said discharge loop over a period exceeding the duration of said switching pulse until the disappearance of said voltage difference, due to the flow of said charging current, at the end of the retrace period.

2. A vertical-sweep generator as defined in claim 1 wherein said switching pulse has a duration of approximately one-fourth of said retrace period.

3. A vertical-sweep generator as defined in claim 1 wherein said amplifier means includes a first transistor in said supply path and a second transistor in series with said first transistor in said discharge loop, said switch means being connected to a control electrode of said second transistor.

4. A vertical-sweep generator as defined in claim 3, further comprising a diode connected across said first transistor for passing said reverse current in the blocked state of said discharge loop.

5. A vertical-sweep generator as defined in claim 3 wherein said storage means includes a condenser normally connected across said source, further comprising switchover means controlled by said clamping means for connecting said condenser in series with said source during the retrace period.

6. A vertical-sweep generator as defined in claim 5 wherein said clamping means comprises a multicollector transistor with a base connected to said source, an emitter connected to a junction of said first and second transistors, and collector leads connected to said electronic switch means and to said switch-over means.

7. A vertical-sweep generator as defined in claim 3 wherein said first transistor is provided with a driving transistor and a protective transistor serially connected across said coil and said sweep capacitor, said driving transistor having input connections to said ramp-current generator, said protective transistor having a base connected to said source.

8. A vertical-sweep generator as defined in claim 7 wherein said input connections include a differential amplifier with a pair of inputs respectively connected to said ramp-current generator and to said storage means.

9. A vertical-sweep generator as defined in claim 8, further comprising a resistor in series with said sweep capacitor, said resistor forming part of a feedback network connected to said noninverting input in parallel with said ramp-current generator.

10. A vertical-sweep generator as defined in claim 1 wherein said oscillator means comprises a free-running multivibrator provided with a trigger circuit including a pair of complementary transistors having a common input terminal energizable by external synchronizing pulses of either polarity to generate a switching pulse.

* * * * *